United States Patent
Hildebrandt (12) 
(10) Patent No.: US 6,590,401 B1
(45) Date of Patent: Jul. 8, 2003

(54) CAPACITIVE PROXIMITY SWITCH FOR EVALUATING MINOR CHANGES IN CAPACITANCE AND METHOD THEREFOR

(75) Inventor: Andreas Hildebrandt, Speyer (DE)

(73) Assignee: Pepperl & Fuchs, Mannheim (DE)

( * ) Notice: Subject to any disclaimer, the term of this patent is extended or adjusted under 35 U.S.C. 154(b) by 0 days.

(21) Appl. No.: 09/762,356

(22) PCT Filed: Aug. 2, 1999

(86) PCT No.: PCT/EP99/05559

§ 371 (c)(1),
(2), (4) Date: Apr. 2, 2001

(87) PCT Pub. No.: WO00/08487

PCT Pub. Date: Feb. 17, 2000

(30) Foreign Application Priority Data

| Aug. 3, 1998 | (DE) | 198 34 891 |
| Sep. 15, 1998 | (DE) | 198 42 189 |
| Sep. 24, 1998 | (DE) | 198 43 749 |

(51) Int. Cl.$^7$ .............................................. G01R 27/26
(52) U.S. Cl. .................. 324/673; 324/662; 324/680; 324/686; 324/690
(58) Field of Search .................. 324/673, 658, 324/661, 662, 672, 679, 680, 686, 687, 690

(56) References Cited

U.S. PATENT DOCUMENTS

| 3,694,741 A | 9/1972 | Abbe | |
| 5,442,347 A | * 8/1995 | Vranish | 324/686 |
| 5,539,292 A | * 7/1996 | Vranish | 318/568.16 |

FOREIGN PATENT DOCUMENTS

| DE | 19701899 | 10/1997 |
| EP | 0564164 | 10/1993 |
| FR | 2371676 | 6/1978 |

* cited by examiner

Primary Examiner—Christine Oda
Assistant Examiner—James C. Kerveros
(74) Attorney, Agent, or Firm—Horst M. Kasper

(57) ABSTRACT

Invention relates to a capacitive proximity switch with an electrical bridge circuit for detecting of an electrically conducting face (15) approaching or moving away, wherein the electrically conducting face (15) is part of a capacitor (for example C1) of the bridge circuit, wherein at least one capacitor (C1, C2, C3, C4) and possibly at least one resistor (R9, R10) are disposed in the bridge branches of the bridge circuit as further reactances, and wherein the bridge is subjected to an alternating voltage as a bridge feed voltage (ubr). The proximity switch includes a flat multilayer printed circuit board (10) having at least two electrically insulating layers (13, 14), wherein an electrically conducting intermediate layer (11) as a first face of a capacitor is disposed between the two electrically insulating layers (13, 14).

19 Claims, 7 Drawing Sheets

CAPACITIVE PROXIMITY SWITCH FOR EVALUATING MINOR CHANGES IN CAPACITANCE AND METHOD THEREFOR

TECHNICAL FIELD

The invention relates to a capacitive proximity switch for the evaluation of capacitance changes with an electrical alternating current measurement bridge of four bridge branches, which reach every two of four switching knots of the bridge, wherein an alternating current is positioned as a bridge feed voltage near two opposite, not neighboring switching knots, and respectively the two bridge branches between the two feed in switching knots build each of the two halves of the bridge, and there is an evaluated bridge diagonal voltage on the two remaining switching knots over diagonal voltage path, wherein the bridge diagonal voltage is removable, for detecting an approaching or moving away face, in particular an electrically bad conductive face or metallic face, which face is part of variable capacitor in one of the bridge branches of the bridge circuit, wherein at least one capacitor (capacitive bridge) or at least one capacitor and/or one resistor (capacitive ohmic bridge) is disposed in the remaining bridge branches as further reactences, wherein rectifiers are arranged to the rectification of the both bridge branch voltages separately according to respective bridge halves in the diagonal voltage paths and the diagonal bridge voltage is evaluated only after the rectification of the both bridge branch voltages as changing direct current corresponding to the capacitance change of the variable capacitor, according to the preamble of the claim one as well as method according to preamble of the claim 9.

STATE OF THE ART

The evaluation of small up to very small changes of capacitance is an always returning task in sensor technology. Very small changes in capacitance, namely in an order of magnitude of less than 10 fF, have to be reliably evaluated in particular in connection with capacitive proximity switches, wherein here in particular the stability against interferences as well as the temperature stability of the respective circuit assumes a central importance.

It is known to employ an oscillator for determining small changes in capacitance, wherein the oscillating amplitude of oscillator changes depending on the capacitance of the sensor. The size of the oscillation amplitude thus is a measure for the value of the capacitance of the sensor. Such a circuit is associated with the disadvantage that the circuit is not stable relative to temperature based on a principle, and therefore an eventually difficult to dimension temperature compensation is necessary in connection with such a circuit in most cases. Furthermore the quality and efficiency of the oscillator is low, wherefrom a broad band circuit with a bad electromagnetic compatibility behavior results.

Furthermore, it is known for the determination of small changes in capacitance to employ an oscillator, wherein the frequency of the oscillator changes depending on the capacity of the sensor. Again the disadvantage is associated with the employment of such a oscillator, that such a circuit is not stable relative to temperature based on a principle, and therefore here again an eventually difficult to dimension temperature compensation is necessary; also such circuit has a relatively bad electromagnetic compatibility behavior. so-called switched capacitor technique is furthermore known for determining small changes in capacitance, wherein a critical timing of the clock cycle signals is of disadvantage and wherefore an extremely stable clock cycle signal is required, which imposes an expensive switching technology depending on the method.

Also integrated circuits are furthermore known for the determination of small changes in capacitance. The integrated circuits exhibit the disadvantage that in most cases a ground free capacitance is necessary. In addition such circuits require in general a digital evaluation unit (mostly a counter) which means a large expenditure for switching technology. Such concepts are employed predominantly in the micro systems technology for these reasons.

It is furthermore known that the determination of small changes of an electrical value can be realized advantageously with the bridge circuits. The value to be measured is here compared with reference values, wherein these reference values are generated by similarly operating elements. Thus temperature influences can be effectively suppressed as long as the two bridge branches of the bridge have at all times the same temperature. Changes of the respective value are then presented as changes of the bridge diagonal voltage. The employment of reactances as bridge elements causes that the bridge has to be operated with alternating current. Thus also the bridge diagonal voltage represents an alternating voltage. The evaluation of the bridge diagonal voltage presents here frequently a problem according to the state of the art, because

- the amplitude of the alternating voltage is very small based on the small change in capacitance, namely a few millivolts mV;
- the frequency of the alternating voltage, which is employed for operating the bridge, and therewith also the frequency of the bridge diagonal voltage is located in the MHz region in order to avoid that the branch currents do not assume too small values given the small capacity values;
- the bridge diagonal voltage in many cases in addition to the alternating voltage component also includes a common mode direct current component with a substantial larger as compared to the alternating current component.

Such previously known solutions are contained for example in the printed documents DE-C2-3143114, DE-A1-3911009, DE-A1-19536198, DE-A1-19701899, CH-558534, as well as in the EP-A1-0723166.

A circuit arrangement for eliminating the influence of a phase shift between the voltage potentials of the two measurement points of an alternating current measurement bridge with complex resistances is furnished, wherein the difference of the voltage potentials forms the measurement signal. A rectifier valve is disposed between the measurement points and the input enclosures of a circuit for forming the difference in each voltage path, wherein a storage disposed between the output of the rectifier valve and a reference potential common to the alternating current measurement bridge is connected following to each of the rectifier valves.

Capacitors employed as capacitive measurement value receivers within an alternating current measurement bridge, either in a bridge circuit with four capacitances or with two capacitances and two resistors, wherein in each case a capacitance is variable, are known from the literature location Heinz Schneider, Kondensatoren als Messwertaufnehmer (Capacitors as measurement value receivers), Elektronik-Applikation Nr. 14, Jul. 9, 1985.

A proximity switch with an alternating current measurement bridge is known by FR-A-2371676, which is subjected to an alternating current. The bridge branch voltages are rectified and subject to single electrical manipulations. Only after the rectification of the bridge branch voltages these as changing direct current as capacitive size are evaluated.

TECHNICAL PURPOSE

It is an object of the present invention to furnish a capacitive proximity switch as well as a method, which is highly sensitive to the approach of the object on one of its sides and by this allow a reliable evaluation of small changes in capacitance, wherein the circuit is to show a high resistance to interferences as well as a high-temperature stability based on its principle. Furthermore, proximity switch is to be realizable with comparatively small expenditure and therefore at low costs.

DISCLOSURE OF THE INVENTION AND ITS ADVANTAGES

The proximity switch according to the present invention comprises a flat multilayer circuit board comprising at least two electrically insulating layers, wherein an electrically conductingly intermediate player is disposed between the two electrically insulating layers as a first place of capacitance in one of the two bridge branches of one of the bridge halves and wherein a flat electrically conducting covering is placed on one of the two layers furnishing a sensor, wherein the flat covering forms the second face of the capacitor, wherein the face is disposed movable relative to the sensor and forms with the sensor a second flat variable capacitor, and wherein the face and the sensor form one capacitance and wherein the sensor and the electrically conducting intermediate layer form the second capacitance of one of the two bridge halves and wherein this construction represents the one half of the bridge, and wherein rectifires are disposed in the diagonal voltage paths for rectifying the two bridge branch voltages separately according to the respective bridge half and wherein the bridge diagonal voltage is evaluated only after the rectification of the two bridge branch voltages as the direct current changing corresponding to the capacitance change of the variable capacitor.

The proximity switch and the method are associated with the advantage that a reliable evaluation of very small capacitance changes is possible, wherein the circuit exhibits a high stability against interferences and a high-temperature stability and wherein the circuit is substantially insensitive relative to coupled in interferences. Similarly the proximity switch can be realized with comparatively small expenditures. The advantages comprise in particular:

no alternating voltage has to be evaluated but only a direct voltage.

a slow operational amplifier or, respectively, comparator can be employed for evaluating the bridge diagonal voltage.

the rectification of the bridge branch voltages can be performed with diodes, whereby the very simple circuit with only a few device elements results; advantageously a so-called slow diode can be employed in order to suppress interferences. Alternatively rectification is performed synchronous with controlled switches, in case a particularly high suppression of interferences is required.

It is important that the rectifiers of the two branches exhibit the same temperature behavior in order for the rectified bridge diagonal voltage to be independent of temperature. It is advantageous for good suppression of interferences that the switching construction is furnished symmetrical, because an interference operating in the same way onto the two bridge branches does not cause the difference voltage at the rectifier outputs.

The rectification of the bridge branch voltages can be performed either by diodes, preferably four diodes, or by controlled switches, preferably four controlled switches, wherein in case of the employment of switches these switches are controlled pairwise in opposite phase and are switched synchronously with the bridge voltage from one switching state to the other.

In addition coupled in interferences can be suppressed effectively, by connecting and switching in each case a low pass filter, a LP-filter, in front of the rectifier of the bridge branch voltages. It is to be observed that the capacitance of the LP-filter can be formed by parasitic capacitances of the rectifier elements, for example barrier layer capacitances or, respectively, diffusion capacitances of the PN-transitions of rectifier diodes for or of the input capacitance of electronic switches, such that also the capacitors can be dispensed with. The electromagnetic compatibility behavior can be improved by the employment of relatively slow rectifier diodes. In this case possibly an additional low pass LP-filtering can be dispensed with.

Also four switches with pairwise opposite phase driving for rectifying the bridge branch voltages can be employed instead of the four diodes. It is thereby possible to rectify also alternating voltages, wherein the amplitude of the alternating voltages is smaller as compared with the threshold voltage of a rectifier diode. Furthermore, interfering voltages are better suppressed because only such alternating voltages are completely rectified, where the alternating voltages are synchronized with the switching signal of the switch. In order to decrease the probability that the interfering signal exhibits in the same frequency as the switching signal of the switch, it is recomended to change continuously the frequency of the bridge voltage and thereby also the frequency of the change signal.

Also two transfer switches can be employed instead of the four individual driven switches with pairwise opposite phase driving.

The face approaching or moving away, which is part of a capacitor of the capacitive proximity switch, can also be grounded.

According to the method, the two bridge branch voltages are rectified separately according to the respective bridge half either by four diodes or by four controlled switches as rectifires in the diagonal voltage paths, wherein the bridge diagonal voltage is driven synchronous with the bridge feed voltage pairwise in opposite phase upon employment of switches which are opened and closed synchronously with the bridge feed voltage pairwise by means of control voltage as well as opposite phase controlled and are switched synchronously with the bridge feed voltage from one switching state into the other switching state. The frequency of the bridge feed voltage and also of the transfer switch signal can be changed continuously.

The two bridge branch voltages are rectified separately according to the respective bridge half either by four diodes or by four controlled switches as rectifires in the diagonal voltage paths for evaluating small changes of capacitance under employing of a capacitive proximity switch, wherein the bridge diagonal voltage is evaluated only after the rectification of the two bridge branch voltages as a direct voltage changing corresponding to the change of the capacitance, and wherein the bridge diagonal voltage is driven synchronous with the bridge feed voltage pairwise in opposite phase upon employment of switches and wherein the bridge diagonal voltage is switched from one switching state into the other switching state synchronous with the bridge voltage. The frequency of the bridge feed voltage and also of the transfer switch signal can be changed continuously.

A balancing of the circuit or, respectively, of the proximity switch is advantageously performed by changing the capacitance of one of the capacitors in one of the bridge branches of the bridge. This can be performed with the aid of a so-called variable tuning capacitor or of a laser trimmed capacitor. It is advantageous to perform the adjustment and balancing such that the difference voltage is equal to zero in the switching point of the proximity switch, since it is then sufficient to evaluate only the sign of the difference voltage. If only the sign of the difference voltage Ud is evaluated, then there results an output signal with the two different states, wherein the switching point at which the sign of the difference voltage Ud changes from one state into the other depends only on the capacitance value of the variable tuning capacitor, however, not on the amplitude or the frequency of the bridge voltage ubr or on the size of the forward flow voltage Uf of the rectifier diodes.

If it is intended to dispense with the balancing with the aid of a variable tuning capacitor, then the zero point of the difference voltage can also be set by having two of the rectifier elements with their one connection not connected to the reference potential, for example ground, but in each case to a reference voltage source, wherein the value of the reference voltage source is set such that the desired difference voltage Ud, that is in most cases zero, is set at the output. If the two reference voltages are derived such from the bridge supply voltage ubr, that a linear connection exists between the respective reference voltage and the bridge supply voltage ubr, then at change of the bridge supply voltage ubr does not affect the bridge diagonal voltage Ud—and thus the balancing—.

Short description of the drawing, where there is shown:

FIGS. 4a, b, c the replacement of two associated rectifier diodes by two associated rectifier and switches or, respectively, the replacement of two associated switches by in each case a transfer switch.

The same elements are furnished with the same reference characters in the figures. For clarification the following terms are employed: 'bridge half' means—graphically in the figures—the left or, respectively right hand side or, respectively, half of the bridge, with 'bridge branch' being the switching part between the two switching knots such that a bridge includes two 'halves' and four 'branches' or, respectively, 'bridge branches'.

PATHS FOR PERFORMING THE INVENTION

Figure 1:
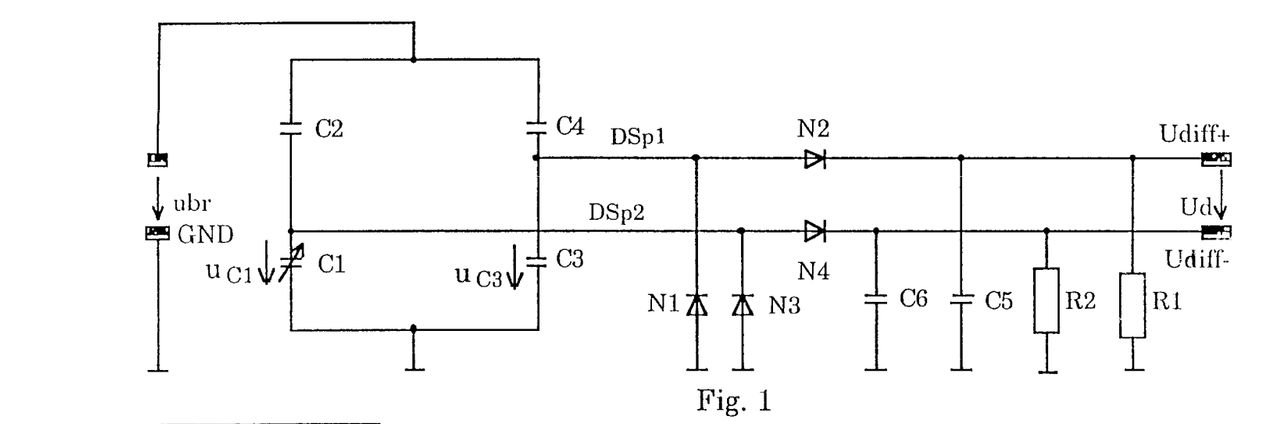
FIG. 1 a principle of or circuit diagram of a capacitive bridge circuit with evaluation according to the present invention.

FIG. 1 shows a principle circuit diagram of a capacitive electrical bridge circuit according to the present invention, such as capacitive electrical bridge circuit can be employed for constructing of a capacitive proximity switch comprising the bridge with in each case a capacitance C1, C2, C3, and C4 in each bridge branch; the capacitance C1 is variable. The bridge is fed by the bridge feed voltage ubr, wherein the bridge feed voltage is an alternating voltage; the reference potential is ground GND.

The two bridge branch voltages uc1 and uc3 from the two bridge halves are rectified separately according to the respective bridge branch with the diodes N2, N1 or, respectively, N4, N3 disposed in the diagonal voltage paths DSp1 and DSp2 and are smoothed in each case relative to ground with capacitors C5, C6 as well as resistances R1 and R2, whereupon the bridge diagonal voltage Ud is evaluated as a direct voltage changing corresponding to the change of the capacitance C1. Plus the bridge diagonal voltage of the diagonal voltage paths DSp1 and DSp2 is obtained only after rectification of the two bridge branch voltages uc1 and uc3 as a difference voltage Ud, that means according to FIG. 1 as a rectified voltage U out of udiff+–udiff–.

Figure 2:
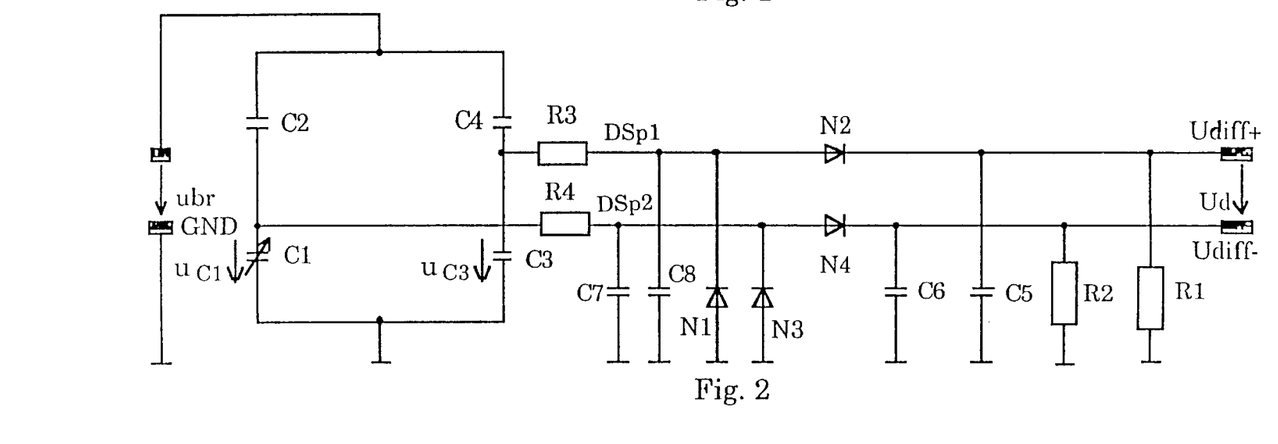
FIG. 2 to the principle of a circuit diagram of FIG. 1 supplemented by in each case a low pass filter in front of the rectifiers.

FIG. 2 shows the principle circuit diagram of FIG. 1 supplemented in each case by a low pass filter in each bridge branch in front of the rectifires N2, N1, N4, N3 for suppressing of coupled in interferences, formed by the resistances R3 and R4 disposed in the diagonal paths Dsp1 and DSp2 for coupling out of the two bridge branch voltages uc1 and uc3 as well as the capacitors C7, C8. The capacitors C7 and C8 of the low pass filter R3-C8 as well as R4-C7 can also be formed by the parasitic capacitances of the elements of the rectifier N1, N2, N3, N4.

Figure 3:
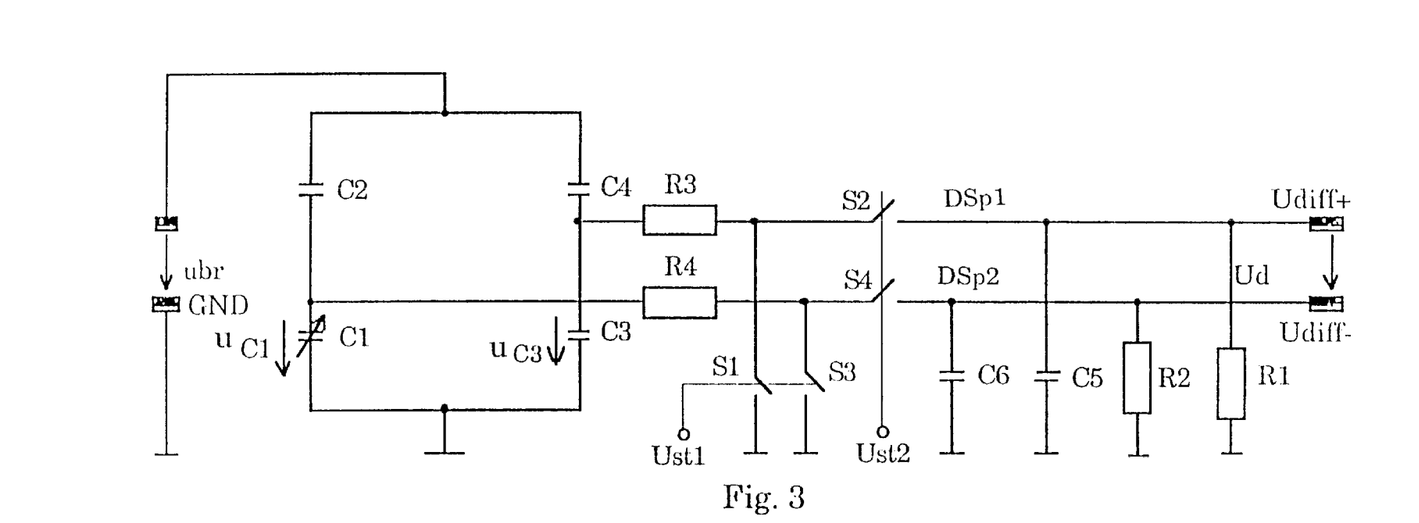
FIG. 3 a principle of a circuit diagram, wherein the rectifier diodes are replaced by switches.
Figure 4:
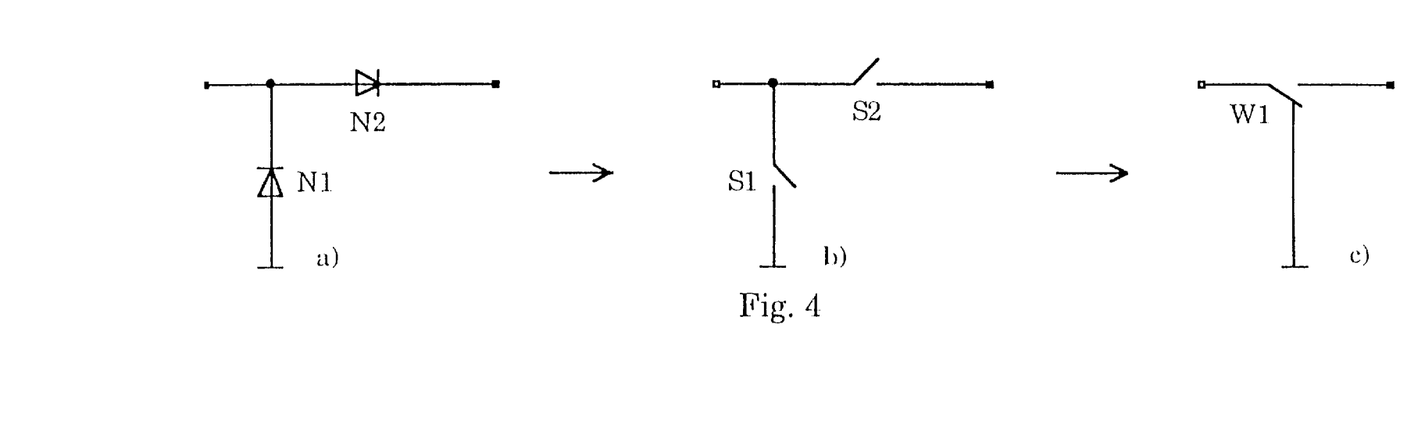

FIG. 3 shows a further principle circuit diagram, wherein the rectifier diodes are replaced by electronic switches S2, S1 or, respectively, S4, S3. The two switches S2, S4 disposed in the respective de-coupling lines of the bridge branches are addressed and closed as well as opened by the control voltage Ust2, the two switches S1, S3 disposed against ground are addressed and closed as well as opened by the control voltage Ust1. These switches are pairwise opposite phase controlled. The capacitances of the respective low pass filters can be formed by parasitic capacitances of the elements of these switches S1, S2, S3, S4 even upon employment of switches and low pass filters.

Figure 5:
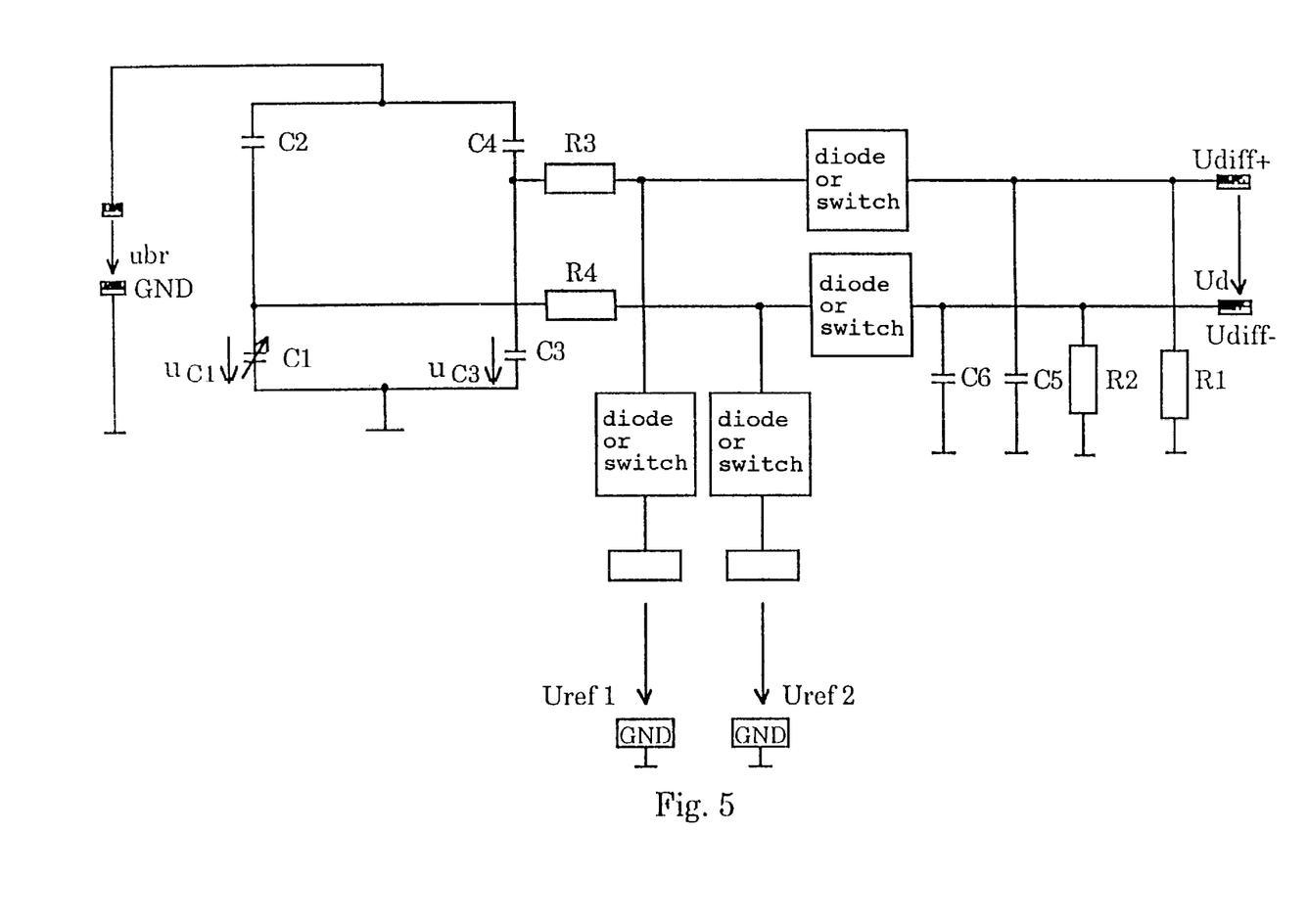
FIG. 5 a principle of a circuit diagram for setting the zero point of the bridge diagonal voltage with two reference voltage sources.

FIG. 5 shows a principle circuit diagram for setting for example the zero point of the bridge diagonal voltage Ud with two reference voltage sources Uref1 and Uref2. Two of the rectifier elements—diodes or switch—are connected with their one connector not to ground but in each case to a reference voltage source Uref1, Uref2 for setting of the zero point of the bridge diagonal voltage Ud, wherein the reference potential is ground GND of the reference voltage sources Uref1, Uref2. The values of the reference voltage source Uref1, Uref2 are adjusted such that the desired bridge diagonal voltage Ud is set at the output.

Figure 6:
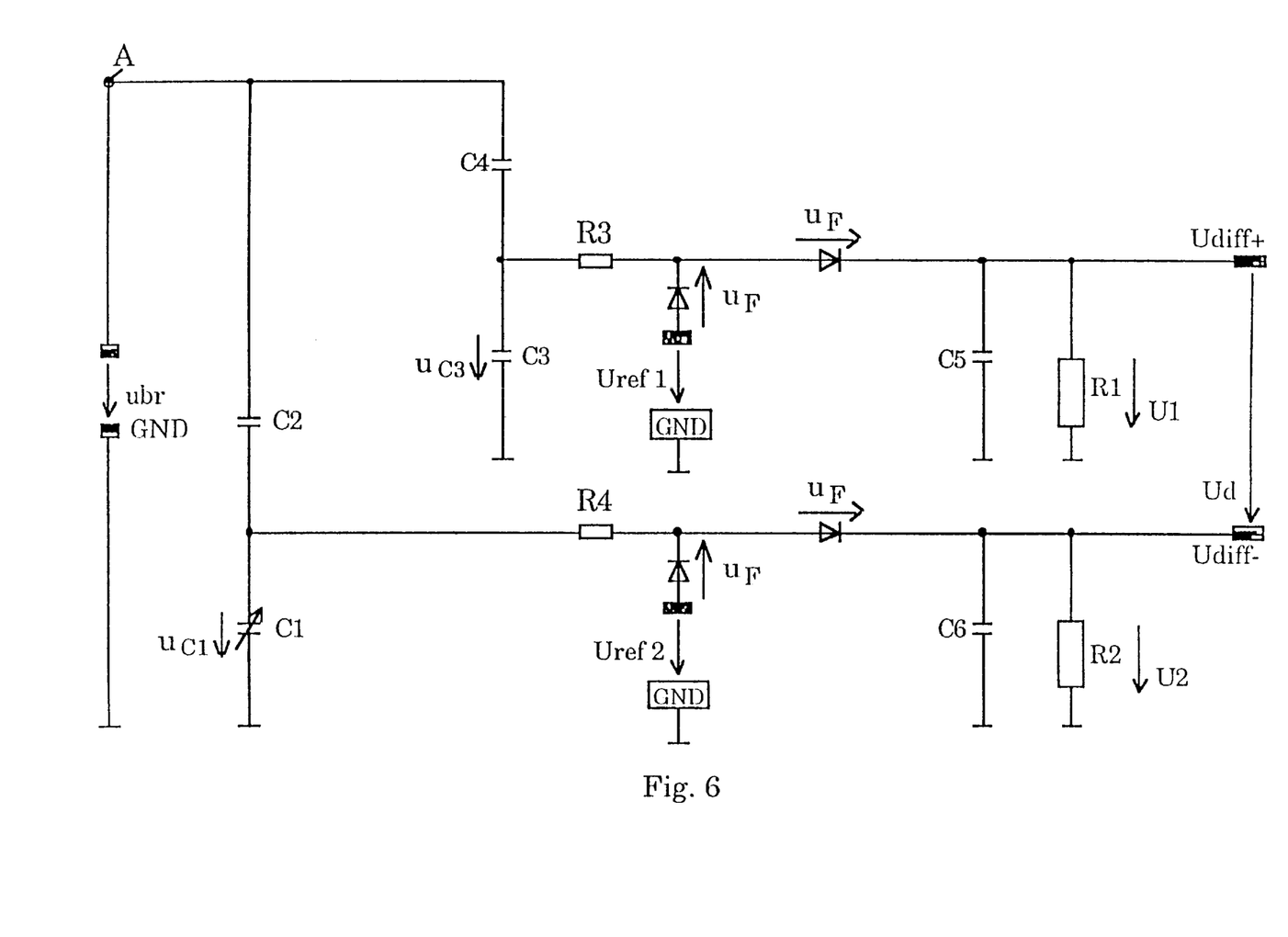
FIG. 6 the employment of diodes with the threshold voltage Uf as rectifying elements in FIG. 5.

FIG. 6 shows the employment of diodes as rectifier elements in FIG. 5, wherein the diodes exhibit the threshold voltage Uf. Then they result of the following relationships:

$$Ud=U1-U2$$

The capacitive voltage dividers of the two bridge branches weaken the signal ubr by the factor k or, respectively k'. If the cathodes of two rectifier diodes are connected to the reference potential, that is to ground, that is in case Uref1=Uref2=0, then one obtains after the rectification the voltages $$toU1=kubr-2Uf \text{ or, respectively, } U2=k'ubr-2Uf$$

Here ubr is the peak-peak-value of the bridge feed voltage. If in contrast the diodes are connected on the cathode side in each case to a reference voltage different from zero, then one obtains $$U1=kubr-2Uf+Uref1 \text{ or, respectively } U2=k'ubr-2Uf+Uref2$$

One then obtains for the difference voltage Ud:

$$Ud=U1-U2=kubr-2Uf+Uref1-k'ubr+2Uf-Uref2=ubr(k-k')+Uref1-Uref2$$

It can recognize from this that for k'=k and for Uref2=Uref1 then the voltageUd becomes zero and in fact independent of the size of the bridge feed voltage ubr. If however k and k' have different values, then there results a difference voltage Ud different from zero. The difference voltage Ud can be made in fact 20 by a suitable choice of Uref1 and Uref2. A disadvantage is however associated with the situation that the described zero balancing depends on the bridge voltage ubr. Therefore it would be necessary in this case to maintain the amplitude of the voltage ubr at a steady value. This is possible in particular in view of temperature changes in general only under substantial expenditures.

Figure 7:
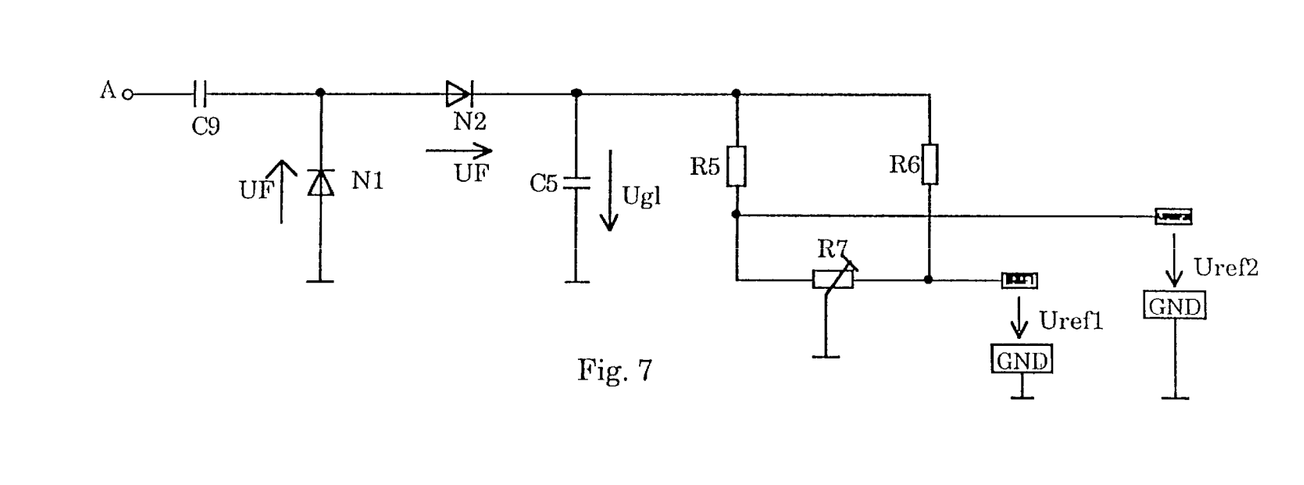
FIG. 7 a possibility for generating the reference voltage by rectifying bridge feed voltage and two voltage dividers.
Figure 8:
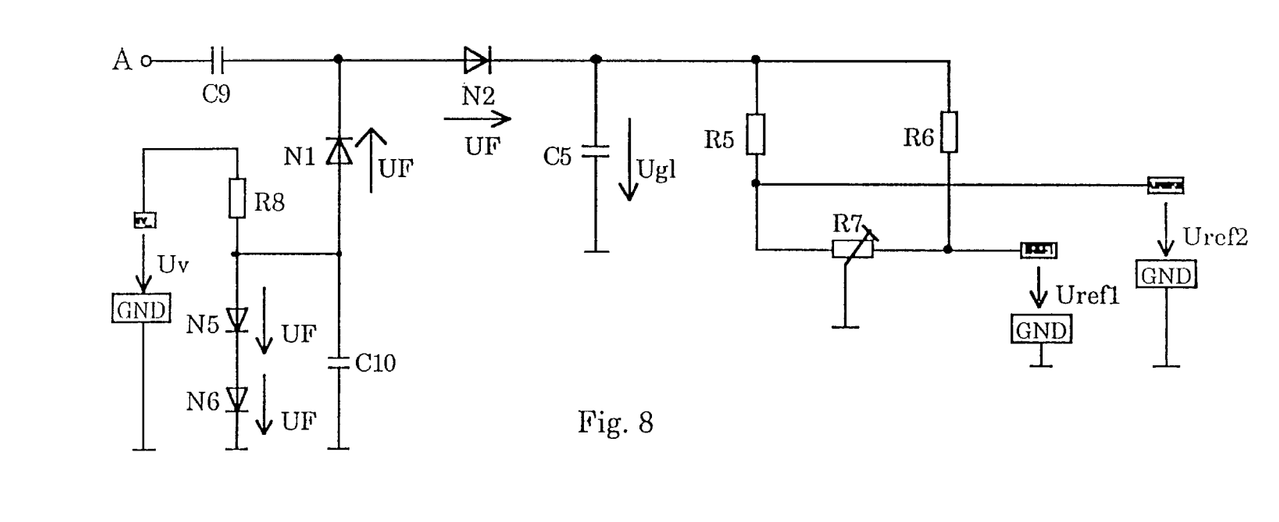
FIG. 8 the circuit diagram of FIG. 7 stranded by N5, N6, R8, C10, and Uv for showing that the rectified voltage Ugl is independent of the forward flow voltage Uf of the rectifier diodes.

FIGS. 7 and 8 show further developments of switching circuits for generating of the reference voltage by rectification of the bridge feed voltage and two voltage dividers for generating of the about describe zero balance independent of the bridge voltage ubr. For this purpose the two reference voltages Uref1 and Uref2 are derived from the bridge feed voltage ubr at the switching point A, compare FIGS. 6 and 7, and in fact in the shape that a linear connection exists between the amplitude of the bridge voltage and the reference voltage in each case. It holds then for the two reference voltages:

$$Uref1=pubr \text{ or, respectively, } Uref2=p'ubr$$

There results then for the difference voltage Ud the following relationship:

$$Ud=ubr(K'-k)+P'ubr-pubr=ubr(k'-k+p'-p)$$

If p' andp are then selected such that holds:

$$k'-k=p-p'$$

Then the difference voltage Ud becomes zero independent of the amplitude of the bridge voltage ubr. A simple possibility for generating the reference voltage according to the above recited relationship comprises to rectify the bridge voltage ubr and to set the bridge voltage to the desired value with in each case of a voltage divider, which is just what is shown in FIG. 7.

FIG. 8 shows a switching circuits, wherein the rectified voltage Ugl is also independent of the forward voltage Uf of the rectifier diodes. The rectified bridge voltage is also temperature dependent based on the temperature dependence of the forward voltage of the rectifier diodes.

The following relationship holds for the rectified voltage Ugl: Ugl=ubr−2Uf.

If the cathode of the rectifier diodes is not connected to the reference potential, that is to ground, but instead to a potential of the height level 2Uf, then the equation simplifies the following expression: Ugl=Ubr.

The rectified voltage is thus independent of the forward voltage Uf.

Figure 9:
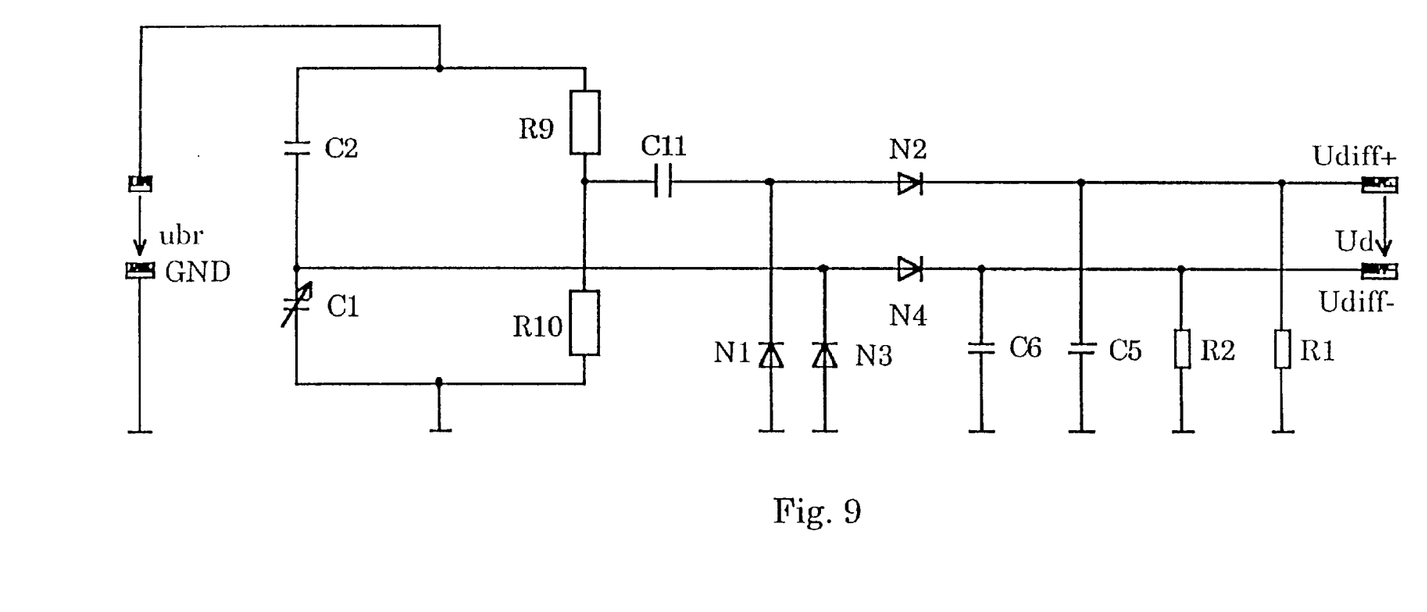
FIG. 9 a further principle of a circuit diagram of a bridge circuit with in each case a capacitance disposed in the one bridge half and an ohmic resistor in each case in the other bridge half, and FIG. 10 a principle of a construction of a capacitive proximity switch with the formation of the capacitances of one bridge branch by different layers of amount the layer circuit board in combination with their environment.

In principle the circuit according to the present invention can also be constructed with a bridge, wherein the bridge comprises two capacitors and two resistors in each bridge branch, which is shown in principle in FIG. 9. A capacitive bridge circuit with in each case a capacitance C1 and C2 as well as in each case an ohmic resistor R9, R10 in each bridge branch is shown in FIG. 9. The corresponding bridge branch voltage has to be decoupled through a capacitor C11 in the bridge half constructed with the resistors R9, R10, otherwise the bridge corresponds to the about describe FIG. 1.

Figure 10:
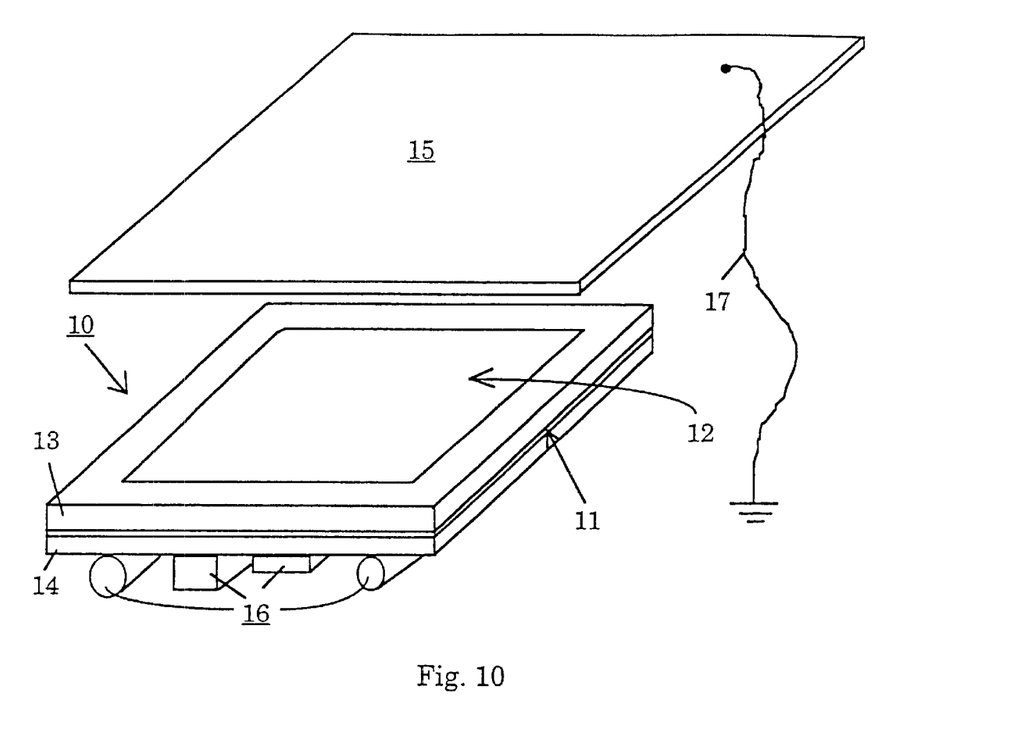

The describe circuit arrangement is in particular suited for the construction of the capacitive proximity switch for detecting of a face 15 approaching or moving away, for example of an electrically bad conductive face or a metal face. FIG. 10 shows a principal construction of such a capacitive proximity switch, which represents ½ of the bridge, with the formation of capacitances over bridge branch by various layers of a flat multilayer circuit board 10 in combination with its surroundings.

The multilayer printed circuit board 10 comprises at least two electrically insulating layers 13, 14, wherein an electrically conducting intermediate layer 11, for example a metallic intermediate layer, is disposed as a first face of a capacitor between the electrically insulating layers 13, 14. A flat, also electrically conducting covering is applied as a sense of 12 on one of the two layers 13 or, respectively, 14, namely here of the upper layers 13, wherein the sensor 12 forms the second face of the capacitor, wherein the face 15, that is in particular an electrically bad conductive face or metal face, is disposed movable relative to the sensor 12 and wherein the face 15 together with the sensor 12 forms the second flat, variable capacitor with for example air as a dielectric. The face 15 can also be grounded by way of a conduit 17. The face 15 together with the sensor 12 for my capacity of the one bridge half, the sensor 12 and the metallic layer 11 form the second capacitance of the same bridge half; this construction represents the one half of the bridge. Further electrical device elements 16 are placed on the side of the multilayer printed circuit board 10 disposed opposite to the sensor 12 and to thus on the lower electrically insulating layer 14.

At differently large change of the bridge diagonal voltage Du results by the construction illustrated in FIG. 10, depending on from which side a face, for example an electrically bad conductive face or the metallic face 15, approaches the multilayer printed circuit board 10. Thus one side of the printed circuit board can operate as a sensor, namely in this case the upper side with the electrically conducting sensor 12, whereas the second side of the printed circuit board, here the layer 14, is insensitive relative to an approach over face, even then when the conducting face is grounded.

The capacitor face formed by the electrically conducting intermediate layer 11 can also be exchanged by a discrete capacitor, which discrete capacitor is connected with a connector to the sensor 12. However, in this case there results and nearly equal sized change of the bridge diagonal voltage Ud, independent of it from which side an electrical conducting face approaches or moves away from the sensor 12. An intermediate layer or a shielding, such as for example the electrically conducting intermediate layer 11, therefore should always then be provided in case the proximity switch is thinner in its thickness construction as the region of influence of the proximity switch.

Thus in a simple way and under favorable costs it is possible to produce capacitive proximity switches in a flat construction shape, wherein the capacitive proximity switches can also be mounted onto a grounded metal part.

COMMERCIAL APPLICABILITY

The subject matter of the present invention is suitable in particular for employment as a highly sensitive capacitive proximity switch. The usefulness of the proximity switch according to the present invention comprises in particular that the proximity switch is on the one side highly sensitive relative to the approach of an object, however, is for practical purposes insensitive against such an approach on the oppositely disposed side.

What is claimed is:

1. A capacitive proximity switch for the evaluation of capacitance changes with an electrical alternating current measurement bridge of four bridge branches, which reach every two of four switching knots of the bridge, wherein an alternating current is positioned as a bridge feed voltage (ubr) near two opposite, not neighboring switching knots, and respectively the two bridge branches between the two feed in switching knots build each of the two halves of the bridge, and there is an evaluated bridge diagonal voltage on the two remaining switching knots over diagonal voltage path (DSp1, DSp2), wherein the bridge diagonal voltage (Ud) is removable, for detecting an approaching or moving away face, in particular an electrically bad conductive face or metallic face, which face is part of variable capacitor (C1) in one of the bridge branches of the bridge circuit, wherein at least one capacitor(C1,C2,C3,C4)(capacitive bridge) or at least one capacitor(C1,C2,C3,C4) and/or one resistor (R9, R10) (capacitive ohmic bridge) is disposed in the remaining bridge branches as further reactances, wherein rectifiers (N1,N2,N3,N4,S1,S2,S3,S4) are arranged to the rectification of two bridge branch voltages (uc1,uc3) separately according to respective bridge halves in the diagonal voltage paths (DSp1, DSp2) and the diagonal bridge voltage (Ud) is evaluated only after the rectification of the two bridge branch voltages (uc1,uc3) as changing direct current corresponding to the capacitance change of the variable capacitor, characterized in that,
   a) the proximity switch comprises a flat multilayer printed circuit board (10) of at least two electrically insulating layers (13,14), wherein an electrically conducting intermediate layer (11) as a first face of a capacitor in one of the two bridge branches of one of the bridge halves is disposed between the at least two electrically insulating layers (13,14)
   b) at one of the layers (13,14) at the opposite side of the intermediate layer (11) a flat electrically conducting covering is placed onto one of the two layers (13,14) as a sensor (12), wherein the electrically conducting covering forms the second face of the capacitor
   c) the face (15) is mobile relative to the sensor (12) and the face (15) forms together with the sensor (12) a flat variable capacitor of the bridge circuit.

2. Proximity switch according to claim 1 characterized in that the recifiers in the diagonal voltage paths (DSp1, DSp2) either diodes (N1, N2, N3, N4) or controlled switches (S1, S2, S3, S4), are preferably four in each case.

3. Proximity switch according to claim 2 characterized in that the switches (S1,S2,S3,S4) are opened and closed synchronously with the bridge feed voltage (ubr) pairwise (S1,S2,S3,S4) by means of control voltage (Ust1,Ust2) as well as opposite phase controlled and are switched synchronously with the bridge feed voltage (ubr) from one switching state into the other switching state.

4. Proximity switch according to claim 3, characterized in that in each case a low pass filters (R3, C8, and R4, C7) are connected and switched in front of the rectifires (N1, N2, N3, N4, or, respectively, S1,S2,S3,S4) of the bridge branch voltages (uc1, uc3).

5. Proximity switch according to claim 4, characterized in that the capacitances of the low pass filters (C8 or, resecptively C7) are formed by the parasitic capacitances of the rectifier elements (N1, N2, N3, N4 or, respectively,S1, S2, S3, S4).

6. Proximity switch according to claim 2, characterized in that two transfer switches (W1, W2) are employed as switches for rectifying of the bridge branch voltages (uc1, uc3).

7. Proximity switch according to claim 1, characterized in that the capacitor face formed by the electrically conducting intermediate layer (11) is replaced by a discrete capacitor, wherein the discrete capacitor is connected with a connection to the sensor (12).

8. Proximity switch according to claim 2, characterized in that the diodes (N1, N2, N3, N4) are slow diodes for proving the stability against interferences.

9. A method for the evaluation of capacitance changes with an electrical alternating current measurement bridge of four bridge branches, which reach every two of four switching knots of the bridge, wherein an alternating current is positioned as a bridge feed voltage (ubr) near two opposite, not neighboring switching knots, and respectively the two bridge branches between the two feed in switching knots build each of the two halves of the bridge, and there is an evaluated bridge diagonal voltage on the two remaining switching knots over diagonal voltage path (DSp1, DSp2), wherein the bridge diagonal voltage (Ud) is removed, for detecting an approaching or moving away face, in particular an electrically bad conductive face or metallic face, which face is part of variable capacitor (C1) in one of the bridge branches of the bridge circuit, wherein at least one capacitor (C1,C2,C3,C4) (capacitive bridge) or at least one capacitor (C1,C2,C3,C4) and/or one resistor (R9,R10) (capacitive ohmic bridge) is disposed in the remaining bridge branches as further reactances, wherein the bridge diagonal voltage (Ud) is evaluated only after rectification of both bridge branch voltages (uc1,uc3) as changing direct current corresponding to the capacitance change of the variable capacitor, characterized in that,
   a) the two bridge branch voltages(uc1, uc3) are rectified separately according to the respective bridge half either by four diodes(N1,N2,N3,N4) or by four controlled switches(S1,S2,S3,S4) as rectifiers in the diagonal voltage paths(Dsp1,Dsp2)
   b) the bridge diagonal voltage is driven synchronously with the bridge feed voltage (ubr) pairwise (S1,S2,S3, S4) upon employment of switches which are opened and closed synchronously with the bridge feed voltage pairwise by means of control voltage (Ust1,Ust2) as well as opposite phase controlled and are switched synchronously with the bridge feed voltage from one switching state into the other switching state c) the frequency of the bridge feed voltage (ubr) and thereby also of the transfer switching signal of the switches (S1,S2,S3,S4) is changed continuously.

10. Method according to claim 9 characterized in that a capacitance of a variable capacitor (C2, C3, C4) is changed such in one of the bridge branches for balancing of the bridge and for setting of the zero point of the bridge diagonal voltage (Ud), that the bridge diagonal voltage (Ud) is equal to zero in the switching point of the proximity switch and only the sign of the bridge diagonal voltage (Ud) is evaluated.

11. Method according to claim 9 characterized in that two of the rectifier elements(N1, N2, N3, N4, S1, S2, S3, S4) are connected to with their one connector in each case to a reference voltage source (Uref1, Uref2) for setting of the zero point of the bridge diagonal voltage (Ud), wherein the respective value of the reference voltage source (Uref1, Uref2) is adjusted such that the desired bridge diagonal voltage (Ud) of the zero volts (0V) is set at the output.

12. Method according to claim 11 characterized in that the two reference voltages (Uref1, Uref2) are derived and rectified from the bridge feed voltage (ubr) for the balancing of the bridge such that a linear relationship exists between the amplitude of the bridge feed voltage (ubr) and the respective reference voltage (Uref1, Uref2).

13. Method according to claim 12, characterized in that the reference voltages (Uref1, Uref2) is set to the desired values with the aid of in each case a voltage divider.

14. A capacitive proximity switch for the evaluation of capacitance changes comprising:

an electrically conducting intermediate layer (11) forming a first face of a fixed capacitor;

an electrically insulating upper layer (13) disposed at an upper side of the electrically conducting intermediate layer (11);

a flat electrically conducting covering placed onto the electrically insulating upper layer (13) for forming a sensor (12), wherein the electrically conducting covering forms a second face of the fixed capacitor and wherein the electrically conducting covering forms a first face of a flat variable capacitor (C1);

an electrically insulating lower layer (14) disposed at a lower side of the intermediate layer (11), wherein the electrically conducting intermediate layer (11), the electrically insulating upper layer (13), the flat electrically conducting covering, and the electrically insulating lower layer (14) form a flat multilayer printed circuit board (10);

a mobile face (15), wherein the mobile face (15) is movable relative to the sensor (12) and wherein the mobile face (15) together with the sensor (12) forms the flat variable capacitor (C1) of the bridge circuit;

an electrical alternating current measurement bridge circuit of four bridge branches, wherein a first bridge branch includes the variable capacitor (C1) and wherein a second bridge branch includes the fixed capacitor, and wherein the bridge branches each reach two of four switching knots of the electrical alternating current measurement bridge circuit;

a current source furnishing an alternating current and positioned as a bridge feed voltage (ubr) near two opposite, not neighboring feed-in switching knots, and wherein two bridge branches between the two feed-in switching knots form each of two halves of the electrical alternating current measurement bridge, and wherein an evaluated bridge diagonal voltage is present on two remaining switching knots over a diagonal voltage path (DSp1, DSp2), wherein the bridge diagonal voltage (Ud) is picked up for detecting an approaching or moving away mobile face (15), and in particular of an electrically bad conductive face or metallic face, which mobile face (15) is part of the variable capacitor (C1) in the first bridge branch of the electrical alternating current measurement bridge circuit;

at least one capacitor(C1,C2,C3,C4)(capacitive bridge) or at least one capacitor(C1,C2,C3,C4) and one resistor (R9,R10) (capacitive ohmic bridge) disposed in the remaining bridge branches not containing the variable capacitor (C1) as further reactance;

rectifiers (N1,N2,N3,N4,S1,S2,S3,S4) arranged and connected to the electrical alternating current measurement bridge for furnishing a rectification of the two bridge branch voltages (uc1,uc3) separately according to respective bridge halves in the diagonal voltage paths (DSp1, DSp2) and wherein a diagonal bridge voltage (Ud) is evaluated only after the rectification of the two bridge branch voltages (uc1,uc3) as changing direct current corresponding to the capacitance change of the variable capacitor (C1).

15. (new) A method for evaluating changes of capacitance changes comprising employtg an electrical alternating cuntnt measurement bridge of four bddge branches, which bridge branches reach every two of four switching knots of the bridge;

using an alternating current and positioning the alternating current as a bridge feed voltage (ubr) near two opposite, not neighboring switching knots, and respectively the two bridge branches between the two feed in switching knots build each of the two halves of the bridge;

placing mi evaluation bridge diagonal voltage on two remaining switching knots over a diagonal voltage pat (DSp1, DSp2);

removing the bridge diagonal voltage (Ud) for detecting an approaching or moving away face, which face is part of variable capacitor (C1) in one of the bridge branches of the bridge circuit;

disposing at least one capacitor(CI,C2,C3,C4)(capacitive bridge) or at least one capacitor(C1,C2,C3,C4) and/or one resistor (R9,R10) (capacitive ohmic bridge) in remaining bridge branches as &rther reactances;

rectifying separately two bridge branch voltages(ucl,uc3) according to the respective bridge half either by four diodes(NI ,N2,N3,N4) or by four controlled switches (S1,S2,S3,S4) disposed as rectifiers in the diagonal voltage paths(Dsp1,Dsp2);

evaluatiiu a bridge diagonal voltage (Ud) only afier rectification of the two bridge branch voltages (ucl,uc3) as changing direct current corresponding to a capacitance change of the variable capacitor;

synchromusly driving the bridge diagonal voltage with the bridge feed voltage (ubr) pairwise (S1,S2,S3.S4) upon employment of switches;

opening and closing the switches synchronously with the bridge feed voltage psirwise by means of control voltage (Ust1,Ust2);

controlling with an opposite phase and switching synchronously the switches with the bridge feed voltage (ubi) from one switching state into the other switching state; and continuously changing the frequency of the bridge feed voltage (ubr) and thereby also of the transfer switching signal of the switches (S1,S2,S3,S4).

16. The method according to claim 15 further comprising changing a capacitance of a variable capacitor (C2, C3, C4) such in one of the bridge branches for balancing of the bridge and for setdng of the zero point of the bridge diagonal voltage (Ud), that the bridge diagonal voltage (Ud) is equal to zero in the switching point of the proximity switch and only the sign of the bridge diagonal voltage (Ud) is evaluated.

17. The method according to claim 15 further comprising connecting two of the rectifier elements(N1, N2, N3, N4, S1, S2, S3, S4) with their one connector in each case to a reference voltage source (Uref1, Uref2) for setting of the zero point of the bridge diagonal voltage (Ud); and adjusting the respective value of the reference voltage source (Ureff, Uref2) such that the desired bridge diagonal voltage (lid) of tern volts (OV) is set at an output.

18. The method according to claim 17 further comprising deriving and rectifying the two reference voltages (Urefl, Uref2) from the bridge feed voltage (ubr) for the balancing of the bridge such that a linear relationship exists between the amplitude of the bridge feed voltage (ubr) and the respective reference voltage (Uref1, Uref2).

19. The method according to claim 18 further comprising setting the reference voltages (Uref1, Uref2) to desired values with the aid of in each case a voltage divider.

* * * * *